United States Patent
Hung et al.

(10) Patent No.: US 9,349,833 B1
(45) Date of Patent: May 24, 2016

(54) SEMICONDUCTOR DEVICE AND METHOD OF FORMING THE SAME

(71) Applicant: UNITED MICROELECTRONICS CORP., Hsin-Chu (TW)

(72) Inventors: Yu-Hsiang Hung, Tainan (TW); Chao-Hung Lin, Changhua County (TW); Ying-Tsung Chen, Kaohsiung (TW); Chih-Kai Hsu, Tainan (TW); Ssu-I Fu, Kaohsiung (TW); Jyh-Shyang Jenq, Tainan (TW); Shih-Hung Tsai, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/614,416

(22) Filed: Feb. 5, 2015

(30) Foreign Application Priority Data

Dec. 26, 2014 (TW) ............................. 103145830 A

(51) Int. Cl.
| | |
|---|---|
| *H01L 21/8234* | (2006.01) |
| *H01L 29/66* | (2006.01) |
| *H01L 21/311* | (2006.01) |
| *H01L 21/28* | (2006.01) |
| *H01L 27/088* | (2006.01) |
| *H01L 23/535* | (2006.01) |

(52) U.S. Cl.
CPC ...... *H01L 29/6656* (2013.01); *H01L 21/28132* (2013.01); *H01L 21/31111* (2013.01); *H01L 23/535* (2013.01); *H01L 27/088* (2013.01); *H01L 29/6653* (2013.01); *H01L 29/66545* (2013.01)

(58) Field of Classification Search
USPC ......................................................... 257/401
See application file for complete search history.

(56) References Cited

U.S. PATENT DOCUMENTS

| | | | |
|---|---|---|---|
| 6,204,161 B1 | 3/2001 | Chung et al. | |
| 8,178,928 B2 * | 5/2012 | Shin ................. | H01L 21/76831 257/368 |
| 8,502,288 B2 | 8/2013 | Guo et al. | |
| 8,697,539 B2 | 4/2014 | Huang et al. | |
| 8,822,283 B2 | 9/2014 | Ng et al. | |
| 8,865,595 B2 | 10/2014 | Chang | |
| 2006/0199321 A1 * | 9/2006 | Lo .......................... | H01L 29/458 438/197 |
| 2011/0079839 A1 * | 4/2011 | Albert ............... | H01L 27/11521 257/321 |
| 2014/0008720 A1 * | 1/2014 | Xie ........................ | H01L 27/092 257/331 |
| 2014/0193955 A1 | 7/2014 | Currie | |

* cited by examiner

*Primary Examiner* — Thao P Le
(74) *Attorney, Agent, or Firm* — Winston Hsu; Scott Margo

(57) ABSTRACT

A semiconductor device includes a plurality of gate structures, a source/drain region, a first dielectric layer, and a floating spacer. The gate structures are disposed on a substrate, and each gate structure includes a gate electrode, a capping layer and a spacer surrounding the gate electrode and the capping layer. The source/drain region is disposed at two sides of the gate electrode. The first dielectric layer is disposed on the substrate and has a height being less than a height of the gate electrode. The floating spacer is disposed on a side wall of the spacer, and also on the first dielectric layer.

11 Claims, 7 Drawing Sheets

SEMICONDUCTOR DEVICE AND METHOD OF FORMING THE SAME

BACKGROUND OF THE INVENTION

1. Field of the Invention

The present invention relates to a semiconductor device and a method of forming the same, and more particularly to a semiconductor device having a floating spacer and a method of forming the same.

2. Description of the Prior Art

The critical dimension (CD) in semiconductor processes has become ever finer with the increasing miniaturization of semiconductor devices. as Along with the continuously shrinking of this dimension, the integrated process of forming a semiconductor device having a metal gate also faces more challenges and limitations.

As the semiconductor industry progresses into nanometer technology process nodes in pursuit of highly integrated and high-speed operation, current techniques utilize miniaturized through holes and inter-layer dielectric layers to form a multilayered an interconnected wiring structure. The method of forming such interconnected wiring structure includes forming a through hole in a dielectric layer, and then sequentially forming various films in the through hole, such as an adhesive layer, a barrier layer and a conductive layer. When the CD of the semiconductor device goes below 14 nanometers (nm), the current techniques can no longer define the position of the through hole, as well as controlling the CD thereof. If a dimensional shift or a dislocated through hole occurs, this can easily lead to serious defects to other elements, thereby affecting the entire performance of the semiconductor device.

For these reasons, current semiconductor devices having metal gates still meet practical requirements, but the current approach for forming such semiconductor device also encounters numerous problems. Therefore, how to improve the current issues while increasing the performance of the device has become an important task in this field.

SUMMARY OF THE INVENTION

It is one of the primary objectives of the present invention to provide a method of forming a semiconductor device that may assist in defining the contact opening, to thereby avoid damaging the gate electrode and form a more reliable device.

It is another of the primary objectives of the present invention to provide a semiconductor device including a floating spacer, for further protecting the gate structure and avoiding damage to the gate electrode.

To achieve the purpose described above, one preferred embodiment of the present invention provides a method of forming a semiconductor device including the following steps. First of all, a gate structure is formed on a substrate, wherein the gate structure includes a gate electrode and a spacer surrounding the gate electrode. Next, a source/drain region is formed at two sides of the gate electrode. Subsequently, a dielectric layer is formed on the substrate, wherein the dielectric layer has a height less than a height of the gate electrode and a portion of the gate structure is uncovered by the dielectric layer. Finally, a floating spacer is formed on a sidewall of the spacer, wherein the floating spacer surrounds the gate structure and is formed on the dielectric layer.

To achieve the purpose described above, one preferred embodiment of the present invention provides a semiconductor device including a plurality of gate structures, a source/drain region, a first dielectric layer and a floating spacer. The gate structures are disposed on a substrate, and each of the gate structures includes a gate electrode and a spacer surrounding the gate electrode. The source/drain region is disposed at two sides of the gate electrode. The first dielectric layer is disposed on the substrate and has a height less than a height of the gate electrode. The floating spacer is disposed on a sidewall of the spacer and the first dielectric layer.

The semiconductor device of the present invention includes the floating spacer which is directly disposed on a top portion of a sidewall of the gate structure. The floating spacer has an etching selectivity relative to the dielectric layer such that the floating spacer may achieve the purpose of protecting the gate electrode. Simultaneously, disposing the floating spacer is sufficient to assist in defining the forming position of the contact opening, which improves the accuracy of the formed device as well as simplifying the forming process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

FIGS. 1-9 illustrate a forming method of a semiconductor device according to a first embodiment of the present invention. First of all, a substrate 100 is provided, and a gate structure 130 is formed in a first dielectric layer 200 on the substrate. The substrate 100 may include a semiconductor substrate, for example, a silicon substrate, an epitaxial silicon substrate, a silicon germanium substrate, a silicon carbide substrate or a silicon-on-insulator (SOI) substrate, or may include a non-semiconductor substrate such as a glass substrate, but this is not limited thereto. Moreover, at least one shallow trench isolation (STI) 102 may be previously formed in the substrate 100 to identify each active area.

Figure 1:
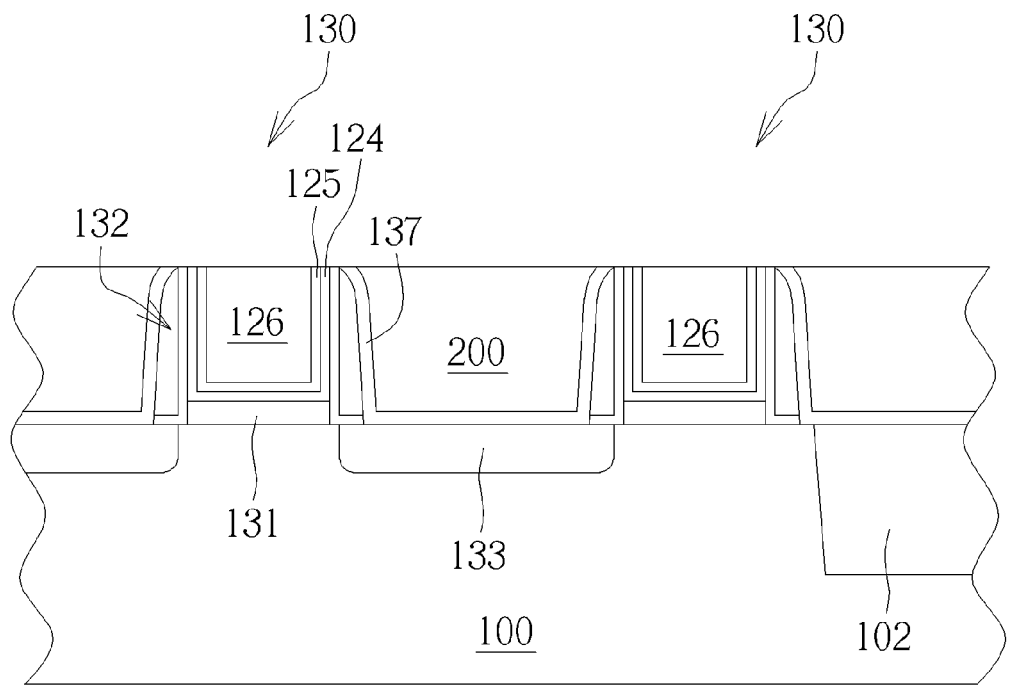
FIG. 1 to FIG. 9 are schematic diagrams illustrating a forming method of a semiconductor device according to a first embodiment of the present invention.

As shown in FIG. 1, the gate structure 130 includes a high-k gate dielectric layer 131, a work function layer 124, a barrier layer 125, agate electrode 126 and a spacer 132. Also, a source/drain region 133 is disposed at two sides of the gate electrode 126. In a preferred embodiment, the high-k gate dielectric layer 131 may include rare earth metal oxides or lanthanide oxides, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide (Yb$_2$O$_3$), yttrium silicon oxide (YbSiO), zirconium aluminate (ZrAlO), hafniumaluminate (HfAlO), aluminum nitride (AlN), titanium oxide (TiO$_2$), zirconium oxynitride (ZrON), hafnium oxynitride (HfON), zirconium silicon oxynitride (ZrSiON), hafnium silicon oxynitride (HfSiON), strontium bismuth tantalite (SrBi$_2$Ta$_2$O$_9$, SBT), lead zirconate titanate (PbZr$_x$Ti$_{1-x}$O$_3$, PZT) or barium strontium titanate (Ba$_x$Sr$_{1-x}$TiO$_3$, BST), but this is not limited thereto.

The method of forming the gate structure 130 of the present embodiment may include firstly forming the high-k gate dielectric layer 131, a sacrificial gate electrode (not shown in the drawings), a cap layer (not shown in the drawing) and the spacer 132 on the substrate 100, forming the source/drain region 133 at two sides of the sacrificial gate electrode in the substrate 100, and then entirely forming a first dielectric material layer (not shown in the drawings) on the substrate 100. Through a planarization process, such as a chemical mechanical polishing/planarization (CMP) process, an etching process, or a combination of both, a portion of the first dielectric material layer is then removed to form the first dielectric layer 200. The cap layer and the sacrificial gate electrode are also completely removed to form a gate trench (not shown in the drawings). A work function metal material layer (not shown in the drawings), a barrier material layer (not shown in the drawings), and a metal gate material layer (not shown in the drawings) are sequentially filled in the gate trench, and a CMP process is carried out to form the work function metal layer 124, the barrier layer 125 and the metal gate 126 as shown in FIG. 1.

The work function metal layer 124 and the barrier layer 125 may be formed through a physical vapor deposition (PVD) process, wherein the work function metal layer 124 may include a P type work function metal, such as a nitride of nickel (Ni), tungsten (W), molybdenum (Mo), tantalum (Ta), or titanium (Ti), or an N type work function metal, such as titanium aluminides (TiAl), aluminum zirconium (ZrAl), aluminum tungsten (WAl), aluminum tantalum (TaAl) or aluminum hafnium (HfAl); and the barrier layer 125 may include Ti/titanium nitride (TiN) or Ta/tantalum nitride (TaN), but is not limited thereto. People skilled in the art should realize that the gate structure 130 of the present invention is not limited to be formed through the above-mentioned steps and materials, and may include other processes or materials. The present invention may also include further forming a contact etching stop layer (CESL) 137 on the substrate 100 to cover the sacrificial gate electrode before the first dielectric material layer is formed. The CESL 137 may include a monolayer structure or a multilayer structure, thereby providing required compressive stress or stretching stress to the gate structure 130. In one embodiment, the CESL 137 may also be omitted. Also, in another embodiment, the present invention may include forming a light doped drain (LDD) region (not shown in the drawings) in the substrate 100 before the spacer 132 is formed according to practical requirements.

Figure 2:
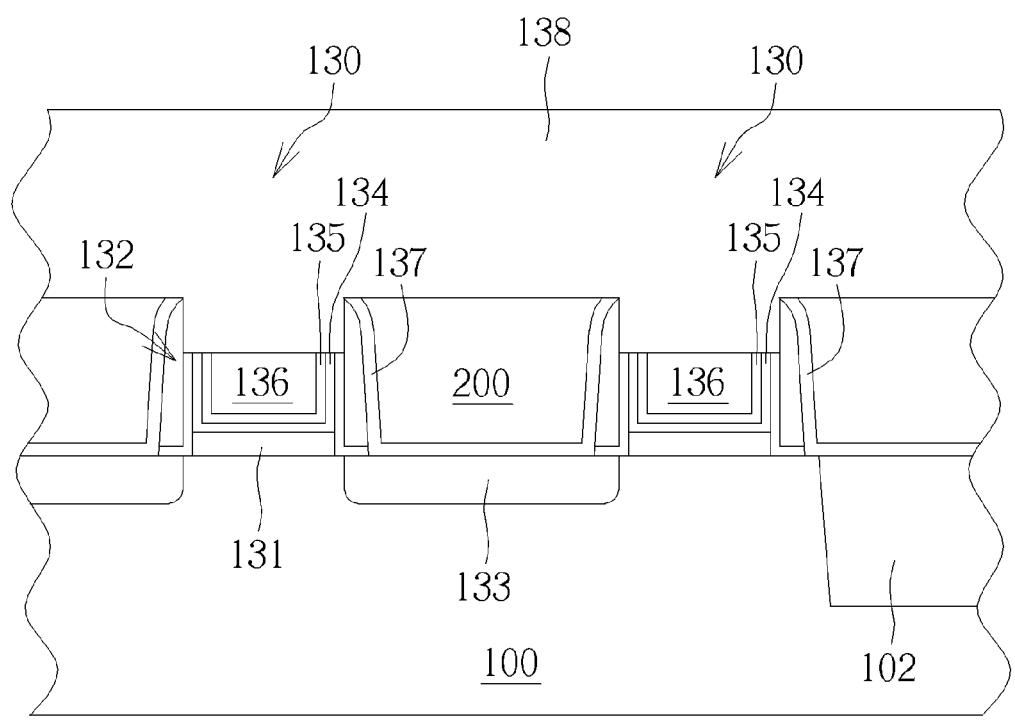
Figure 3:
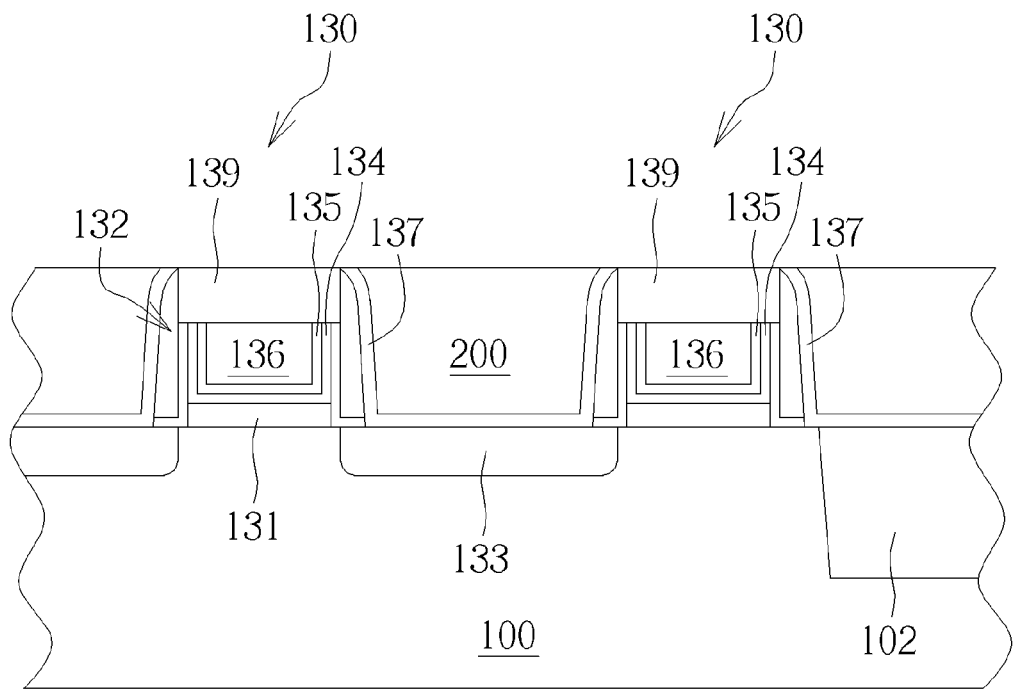
Figure 4:
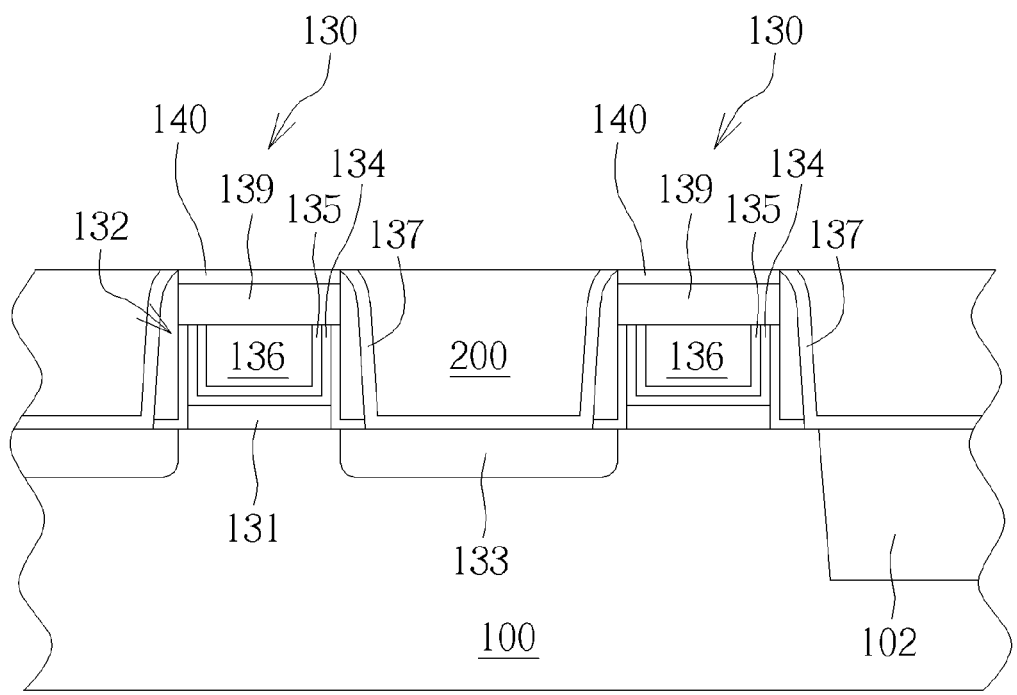

As shown in FIGS. 2-4, an etching back process is carried out to partially remove the work function metal layer 124, the barrier layer 125, and the gate electrode 126, to form a trench (not shown in the drawings), a U-shaped work function metal layer 134, a U-shaped barrier layer 135, and a gate electrode 136. In the following, a capping layer is formed in the trench on the work function metal layer 134, the barrier layer 135 and the gate electrode 136. In the present embodiment, the capping layer includes a multilayer structure having a first capping layer 139, such as a silicon nitride (SiN) layer, and a second capping layer 140, such as a TiN layer. In one embodiment, the method of forming the capping layer may include filling in a first capping material 138 in the trench as shown in FIG. 2, and removing the first capping material 138 outside the trench through another planarization process, such as a CMP process, as shown in FIG. 3. Subsequently, another etching back process may be carried out through a similar or the same approach, to remove a portion of the first capping material layer 138 to form the first capping layer 139. Then, as shown in FIG. 4, the second capping layer 140 is formed on the first capping layer 139. The present invention is not limited to the above-mentioned process, however. For example, in another embodiment, the capping layer may also include a monolayer structure or other materials; and in the other embodiment, the capping layer may even be omitted, such that the aforementioned etching back processes of the work function metal layer, barrier layer and the gate may also be omitted, and the following process may be directly performed on the gate structure 130 shown in FIG. 1.

Figure 5:
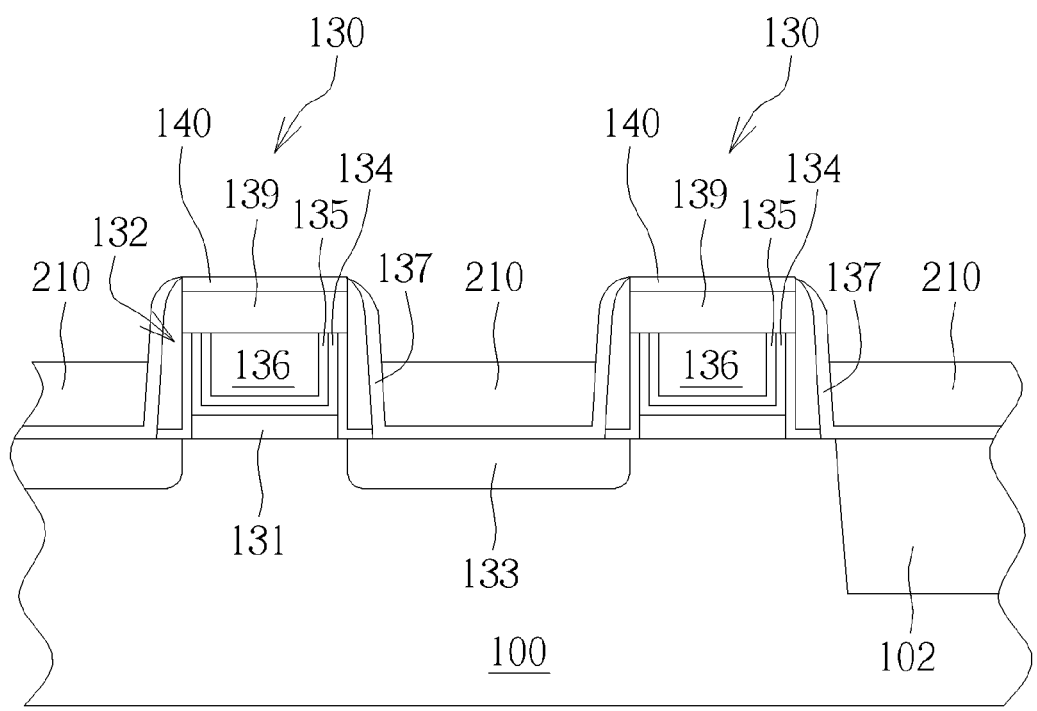

As shown in FIG. 5, an etching back process such as a dry etching process, a wet etching or a sequentially performed dry and wet etching process, is carried out on the first dielectric layer 200 by using the second capping layer 140 and the spacer 132 to serve as an etching mask, thereby removing a portion of the first dielectric layer 200 to form a first dielectric layer 210 and to expose a portion of the gate structure 130. In other words, the first dielectric layer 210 only covers a bottom portion of the gate structure 130, and a top surface of the first dielectric layer 210 is lower than a top surface of the gate electrode 136 but is higher than half of the gate electrode 136. In the present embodiment, the first dielectric layer 210 is disposed on the CESL 137, such that the first dielectric layer 210 only contacts a bottom portion of a sidewall of the CESL 137; however, the present invention is not limited thereto. In another embodiment, the first dielectric layer may directly be formed on the source/drain region and directly contacts a bottom portion of a sidewall of the spacer, while the CESL is omitted.

Figure 6:
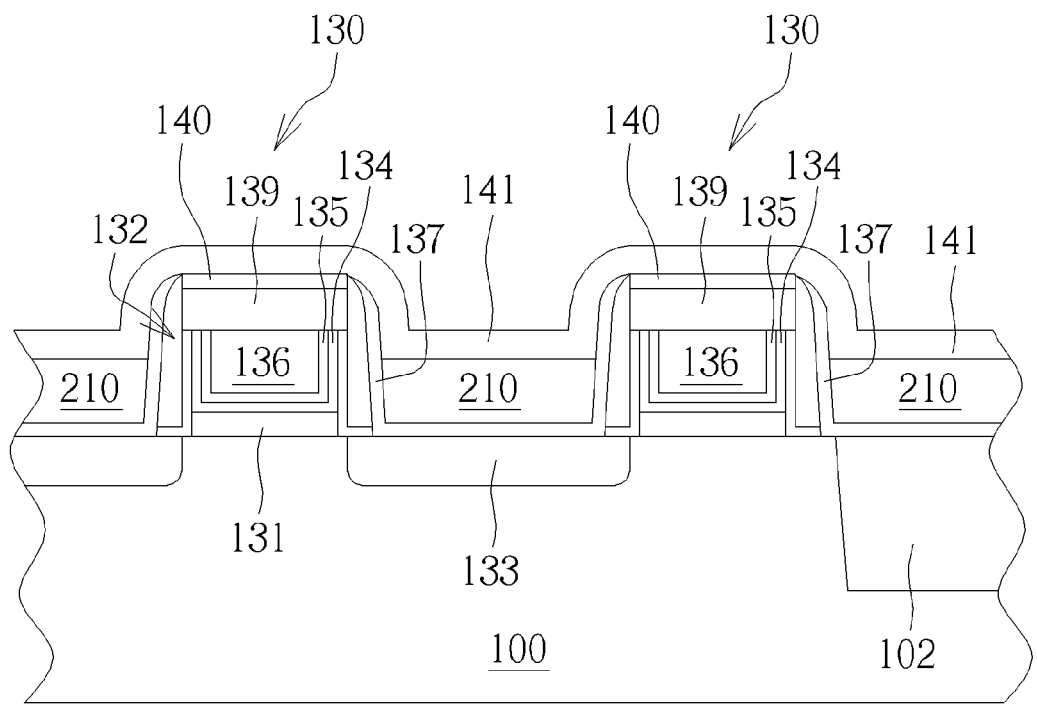
Figure 7:
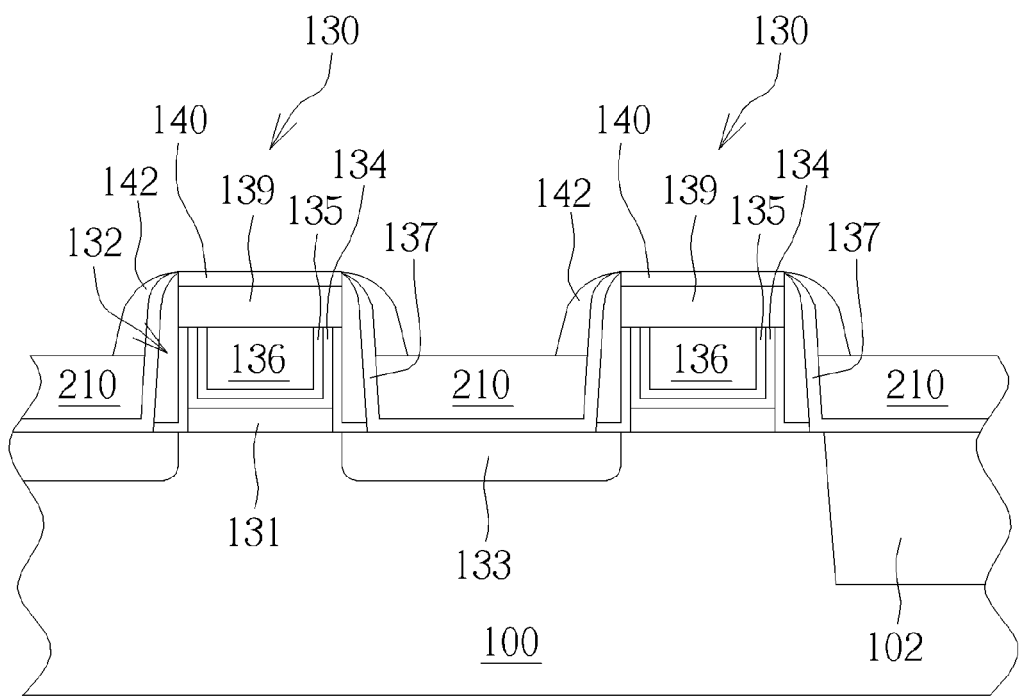

As shown in FIGS. 6-7, a floating spacer 142 is formed on the gate structure 130 after the etching back process is performed on the first dielectric layer. The method of forming the floating spacer 142 may include entirely forming a floating spacer material layer 141 as shown in FIG. 6, wherein after the first dielectric layer 210 is formed by the etching back process, the floating spacer material layer 141 is formed entirely to cover the first dielectric layer 210 and the gate structure 130; and partially removing the floating spacer material layer 141 by using an etching process, such as a dry etching process, to form a floating spacer 142 as shown in FIG. 7. The floating spacer material layer 141 may include a material having an etching selectivity relative to the second capping layer 140 and the first dielectric layer 210, such as silicon nitride, but is not limited thereto. The floating spacer 142 is formed on the first dielectric layer 210 so that the floating spacer 142 only contacts a top portion of the sidewall of the CESL 137 or a top portion of the sidewall of the spacer 132 while the CESL 137 is omitted. Thus, a portion of the first dielectric layer 210 will be sandwiched between the floating spacer 142, the gate structure 130 and the source/drain region 133, as shown in FIG. 7. The method of forming the floating spacer in the present invention is not limited to the above-mentioned steps, and may include other processes. For example, in another embodiment, the method may include removing the second capping layer 140 optionally, after the floating spacer 142 is formed.

Figure 8:
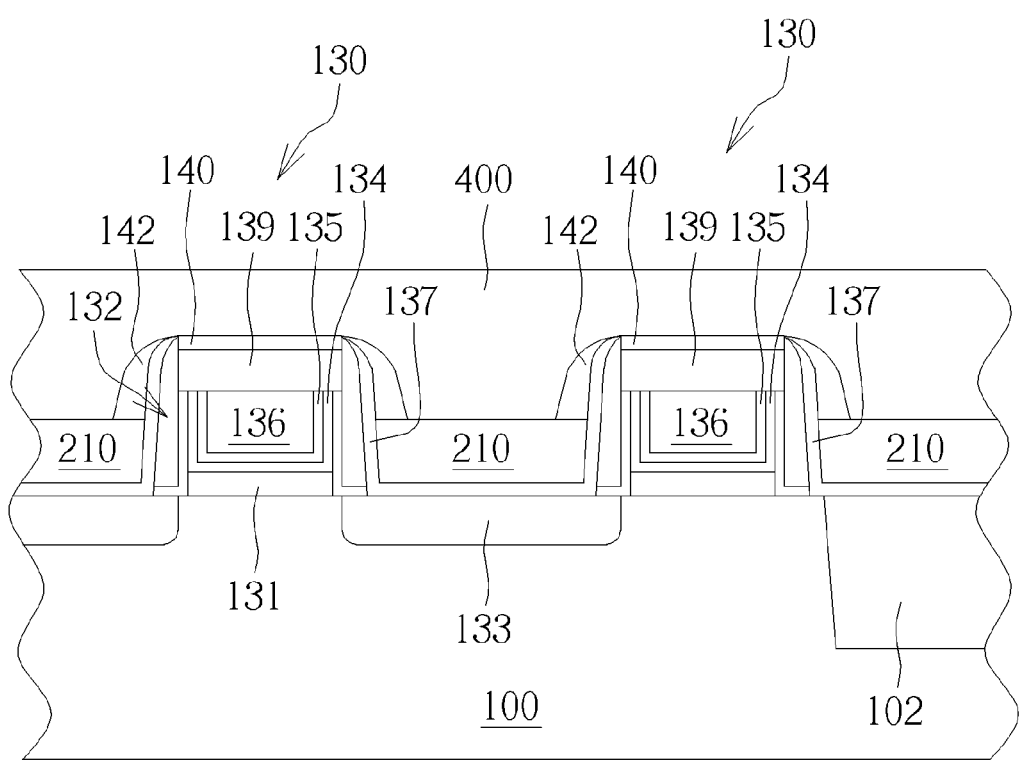

As shown in FIG. 8, a second dielectric layer 400 is formed entirely on the substrate, covering the gate structure 130 and the first dielectric layer 210. After the floating spacer 142 is formed, a second dielectric material layer (not shown in the drawings) is entirely formed to cover the substrate 100 and the first dielectric layer 210. In one embodiment, the second dielectric material layer may include the same material as the first dielectric layer 210, but is not limited thereto. Another planarization process (such as a CMP process or an etching process) may be performed further to form a second dielectric layer 400 as shown in FIG. 8.

Figure 9:
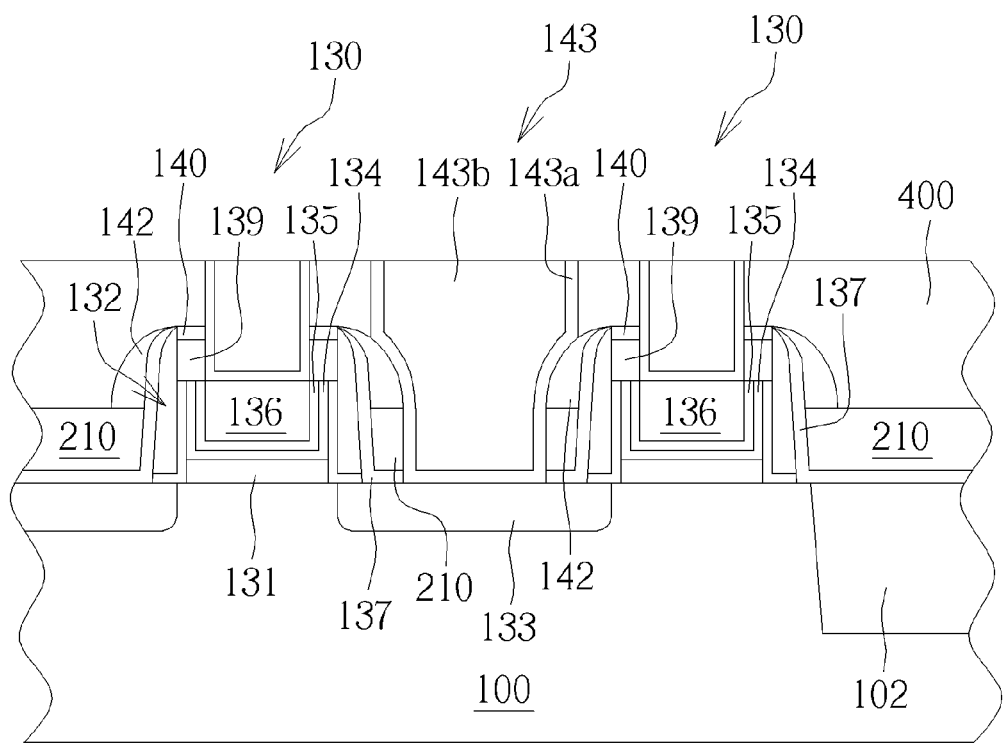

Finally, as shown in FIG. 9, a contact plug 143 is formed in the first dielectric layer 210 and the second dielectric layer 400, to electrically connect the source/drain region 133. The contact plug 143 may include an adhesive layer 143a and a conductive layer 143b, wherein the adhesive layer 143a may include Ti, Ta, TiN, TaN or a composite of above-mentioned materials, and the conductive layer 143b may include W, copper (Cu) or aluminum (Al), but is not limited thereto. The method of forming the contact plug 143 may include sequentially etching the second dielectric layer 400 and the first dielectric layer 210 to form a contact opening (not shown in the drawings) in the second dielectric layer 400 and the first dielectric layer 210, and then sequentially forming the adhesive layer 143a and the conductive layer 143b in the contact opening. It is noted that, while forming the contact opening, the etching process will not damage the floating spacer due to the etching selectivity between the floating spacer 142 and the dielectric layers 210, 400, but will downwardly etch the dielectric layers 210, 400 along the outer sidewall of the floating spacer 142, thereby forming the contact opening adjacent to the floating spacer 142. The floating spacer 142 can increase the process window of the contact opening, so as to achieve the purpose of protecting the gate structure 130. Furthermore, after the contact plug 143 is formed, a portion of the first dielectric layer 210 is sandwiched between the floating spacer 142, the gate structure 130 and the contact plug 143.

Through the aforementioned processes, the semiconductor device of the first embodiment of the present invention as shown in FIG. 9 is obtained. The semiconductor device includes at least one gate structures 130 disposed in the first dielectric layer 210 on the substrate 100, wherein the gate structure 130 includes the gate electrode 136 and the spacer 132 surrounding the gate electrode 136. Also, the source/drain region 133 is disposed at two sides of the gate electrode 136, and the CESL 137 layer covers the gate structure 130. The semiconductor device further includes the floating spacer 142 which is disposed on the sidewall of the CESL 137. The floating spacer 142 is disposed on the first dielectric layer 210 which surrounds the gate structure 130 such that the floating spacer 142 only directly contacts the top portion of the sidewall of the CESL 137. The present invention is not limited thereto; in another embodiment, the floating spacer is also disposed on a portion of the first dielectric layer but directly contacts the top portion of the sidewall of the spacer of the gate structure, while the CESL is omitted.

Additionally, the semiconductor device includes the contact plug 143 which is electrically connected to the source/drain region 133, wherein the contact plug 143 is disposed in the second dielectric layer 400 and the first dielectric layer 210, and includes the adhesive layer 143a and the conductive layer 143b. The contact plug 143 directly contacts the floating spacer 142, and the portion of the first dielectric layer 210 underneath such that the portion of the first dielectric layer 210 may be disposed between the gate structure 130, the contact plug 143 and the floating spacer 142. Moreover, since the contact plug 143 is formed along the floating spacer 142, a top portion of the contact plug 143 may have a relatively greater diameter in comparison with that of a bottom portion, thereby facilitating the forming method.

As detailed in the aforementioned embodiments, the semiconductor device of the present invention has a floating spacer formed on the sidewall of the gate structure and being disposed on a dielectric being lower than the gate electrode, and only contacting the top portion of the sidewall of the gate structure, to achieve the purpose of protecting the gate electrode. By disposing the floating spacer, the forming position of the contact opening can be defined, which improves the accuracy of the formed device, as well as to simplifying the forming process. People skilled in the art will realize that the semiconductor device is not limited to be formed via the above-mentioned processes, and may also include other processes.

The following description will detail other different embodiments or variations of the forming method of the semiconductor device of the present invention. To simplify the description, the following description will only detail dissimilarities between the different embodiments and identical features will not be described. In order to compare the differences between the embodiments easily, identical components in each of the following embodiments are marked with identical symbols.

Figure 10:
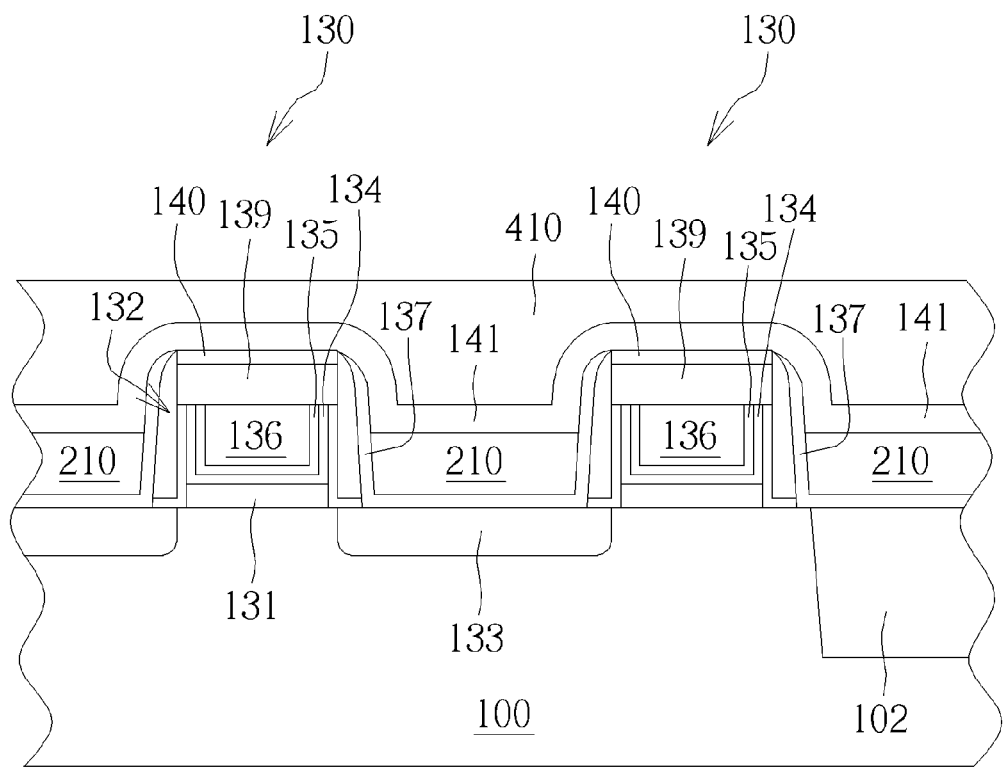
FIG. 10 to FIG. 11 are schematic diagrams illustrating a forming method of a semiconductor device according to a second embodiment of the present invention.
Figure 11:
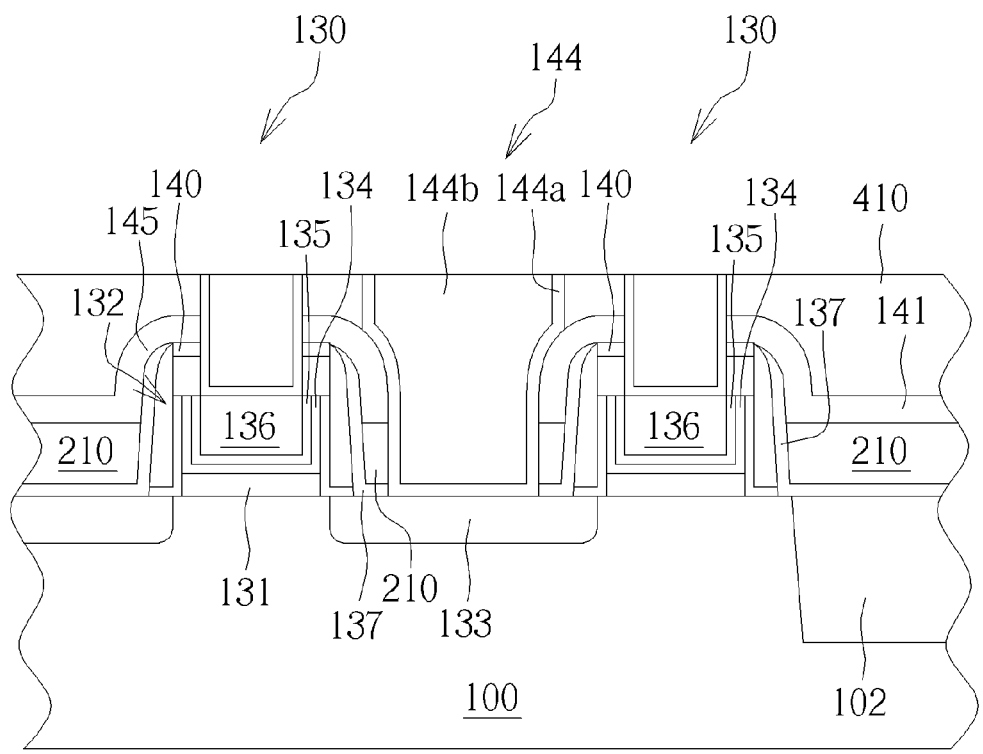

FIG. 10 to FIG. 11 are schematic diagrams illustrating a forming method of a semiconductor device according to the second embodiment of the present invention. The formal steps in the present embodiment are similar to those in FIGS. 1-6 in the first embodiment and are not described herein. As shown in FIG. 10, the differences between the present embodiment and the aforementioned first embodiment are that, after forming the semiconductor structure shown in FIG. 6, a second dielectric layer 410 is directly formed to cover the substrate 100 and the gate structure 130. The differences between the present embodiment and the aforementioned first embodiment are characterized by directly forming the second dielectric layer 410 after forming the floating spacer material layer 141 to cover the floating spacer material layer 141. Subsequently, similar to the first embodiment, a contact plug 144 is formed in the first dielectric layer 210 and a second dielectric layer 410, wherein the contact plug 144 includes an adhesive layer 144a and a conductive layer 144b. The floating spacer 145 of the present embodiment is simultaneously formed as the contact plug 144 is formed, and a portion of the floating spacer 145 is disposed on the top portion of the gate structure 130 (namely, the second capping layer 140) as shown in FIG. 11, for protecting the top portion of the gate structure 130 while forming the contact opening and avoiding damage to the gate electrode. In this way, a portion of the first dielectric layer 210 may be sandwiched between the floating spacer 145, the gate structure 130, the source/drain region 133 and the contact plug 143. Except for the aforementioned differences, other steps of the present embodiment are all the same or similar to those of the first embodiment. The method of the present invention is not limited to the above-mentioned steps, and may include other processes. For example, in another embodiment, the capping layer may be omitted, such that a portion of the floating spacer may be directly disposed on the top portion of the gate electrode for protecting the gate electrode.

Figure 12:
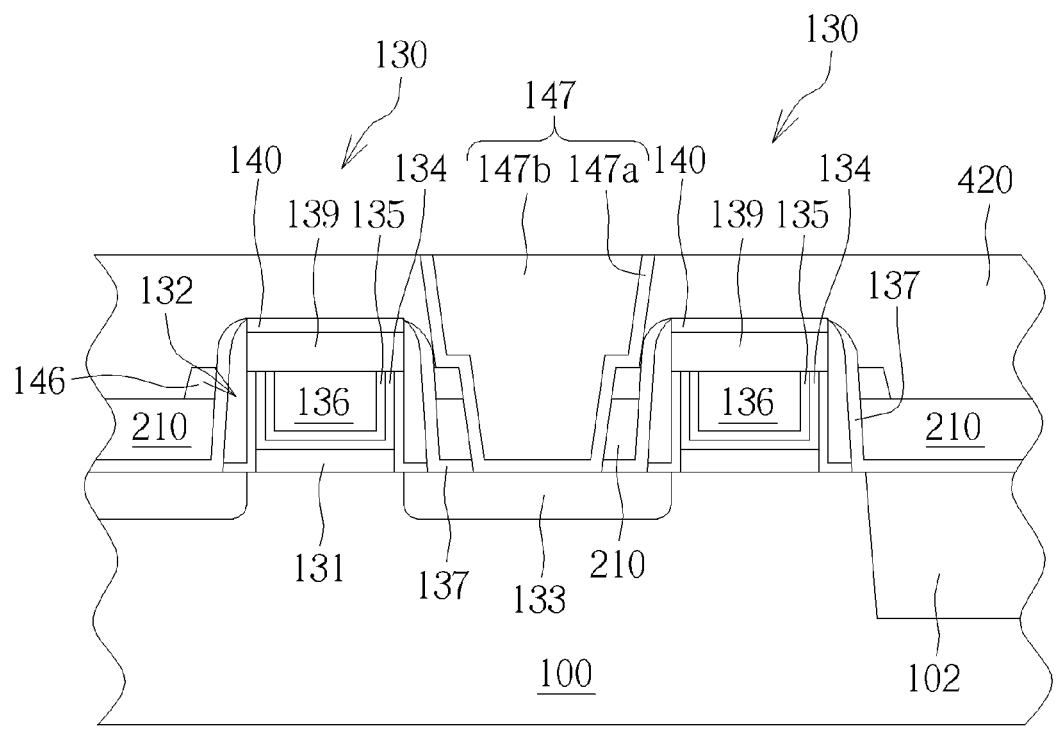
FIG. 12 is a schematic diagram illustrating a forming method of a semiconductor device according to a third embodiment of the present invention.

FIG. 12 illustrates a forming method of a semiconductor device according to a third embodiment of the present invention. The steps in the present embodiment are similar to those of the first embodiment illustrated in FIGS. 1-6 and therefore are not described herein. The differences between the present embodiment and the aforementioned first embodiment are that, after forming the semiconductor structure shown in FIG. 6, a portion of the floating spacer material layer 141 is removed through an etching process, such as a dry etching process, to form a spacer (not shown in the drawings), and a vertical height of the spacer is reduced by using an etchant or etching gas to form a floating spacer 146 as shown in FIG. 12. In one embodiment the etchant or the etching gas may include phosphoric acid, but this is not limited thereto. The floating spacer 146 only contacts a portion of the sidewall of the CESL 137, or a portion of the sidewall of the spacer 132 of the gate structure 130 (while the CESL 137 is omitted), partially exposing the top portion of the sidewall of the CESL 137, or the top portion of the sidewall of the spacer 132 of the gate structure 130. In this way, the second dielectric layer 420 formed in the following may directly cover the exposed portion of the top portion of the sidewall of the CESL 137, or the exposed portion of the top portion of the sidewall of the spacer 132 as in FIG. 12. Subsequently, similar to the first embodiment, a contact plug 147 (including an adhesive layer 147a and a conductive layer 147b) is formed to electrically connect the source/drain region 133, wherein the features and the forming method of the contact plug are substantially the same as those of the first embodiment.

Figure 13:
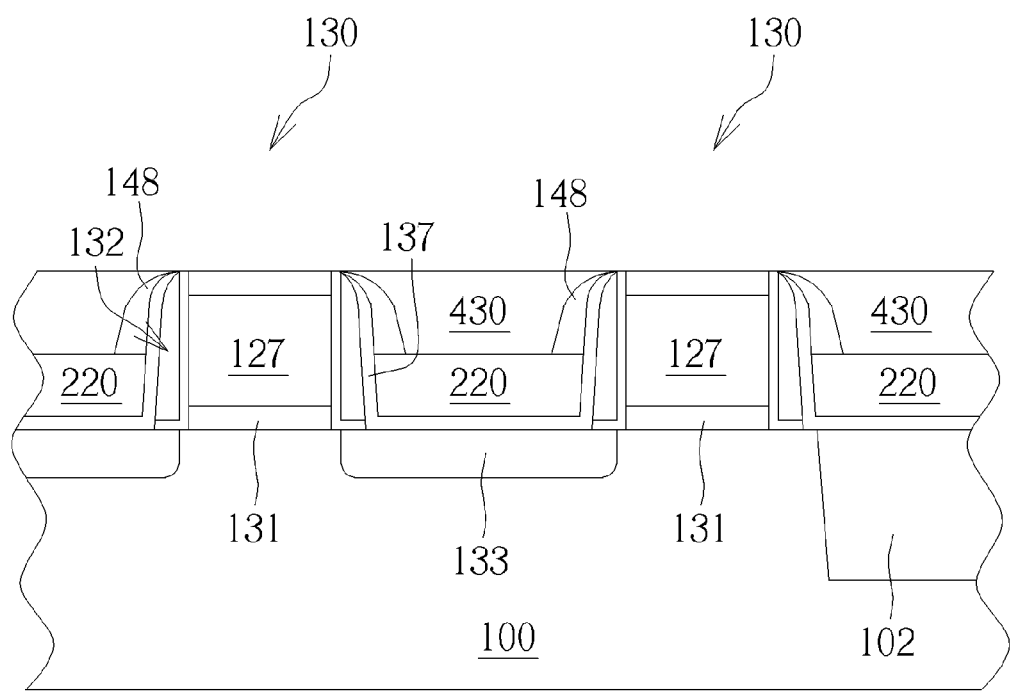
FIG. 13 to FIG. 14 are schematic diagrams illustrating a forming method of a semiconductor device according to a fourth embodiment of the present invention.
Figure 14:
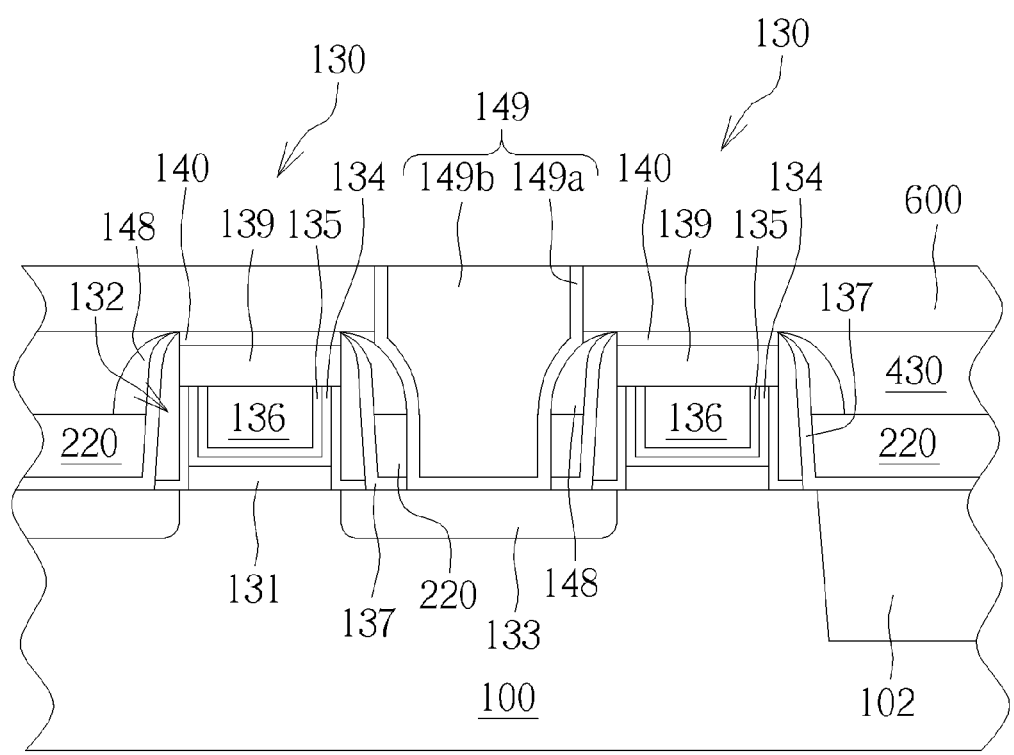

FIG. 13 to FIG. 14 are schematic diagrams illustrating a forming method of a semiconductor device according to a fourth embodiment of the present invention. The differences between the present embodiment and the aforementioned first embodiment are that the etching back process of the first dielectric layer 200 is carried out before forming the gate structure 130 as shown in FIG. 1, to form a first dielectric layer 220 having a height lower than a height of the sacrificial gate electrode 127 (for example, lower than half the height of the sacrificial gate electrode 127), as shown in FIG. 13. A floating spacer 148 is then formed. The floating spacer 148 is formed on the first dielectric layer 220 such that the floating spacer 148 only contacts the top portion of the sidewall of the CESL 137, or the top portion of the sidewall of the spacer 132 (while the CESL 137 is omitted). Thus, a portion of the first dielectric layer 220 may directly contact a bottom portion of the sidewall of the CESL 137 as shown in FIG. 13. Otherwise, the portion of the first dielectric layer 220 may directly contact a bottom portion of the sidewall of the spacer 132 while the CESL 137 is omitted. After forming the second dielectric layer 430 as shown in FIG. 13, the gate structure 130 may be formed through the steps described in the first embodiment. Except for the aforementioned differences, the forming methods and the material features of the floating spacer 148, the second dielectric layer 430 and the gate structure 130 are all the same or similar to that of the first embodiment.

As shown in FIG. 14, a third dielectric layer 600 and a contact plug 149 are then formed sequentially, wherein the dielectric layer 600 covers the second dielectric layer 430, and the contact plug 149 (including an adhesive layer 149a and a conductive layer 149b) is electrically contacted to the source/drain region 133. The contact plug 149 of the present embodiment is disposed in the first dielectric layer 220, the second dielectric layer 430 and the third dielectric layer 600, as shown in FIG. 14.

In summary, the present invention provides a semiconductor device having a floating spacer and a method of forming the same. In the semiconductor device of the present invention, since the floating spacer is directly disposed on a portion of a sidewall of the gate structure and has an etching selectivity relative to the dielectric layer, the floating spacer can achieve the purpose of protecting the gate electrode. Disposing the floating spacer can also assist in defining the forming position of the contact opening, so as to improve the accuracy of the formed device, as well as simplifying the forming process.

Although the aforementioned embodiments are exemplified as a "gate-last" process and a "high-k first" process, in another embodiment the semiconductor device of the present invention may also be formed through a "gate-first" process or a "high-k last" process. For example, the present invention may include removing the high-k gate dielectric layer 131 before the work function metal layer 124 is formed, and then forming another high-k gate dielectric layer, the work function metal layer and the metal gate sequentially in the gate trench. Thus, the high-k gate dielectric layer disposed in the gate trench may also include the U-shaped cross-section (not shown in the drawings). Furthermore, although the aforementioned embodiments are mainly applied to a method of forming a planar transistor, the present invention may also be used in a method of forming other non-planar transistors, such as a fin field-effect transistor (finFET).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a plurality of gate structures disposed on a substrate, wherein each of the gate structures comprises:
     a gate electrode
     a capping layer, disposed on the gate electrode; and
     a spacer surrounding the gate electrode and the capping layer;
   a source/drain region disposed at two sides of each gate electrode;
   a contact etching stop layer (CESL) disposed on the substrate;
   a first dielectric layer disposed on the CESL; and
   a floating spacer disposed on a sidewall of each spacer and the first dielectric layer.

2. The semiconductor device according to claim 1, wherein the floating spacer covers a top portion of the spacer.

3. The semiconductor device according to claim 1, wherein a portion of the floating spacer covers the gate electrode.

4. The semiconductor device according to claim 1, wherein a top portion of the spacer is partially exposed by the floating spacer.

5. The semiconductor device according to claim 1, wherein the capping layer comprises a multilayer structure.

6. The semiconductor device according to claim 1, wherein the first dielectric layer having a height less than a height of the gate electrode.

7. The semiconductor device according to claim 6, further comprising:
   a second dielectric layer disposed on the first dielectric layer; and
   a contact plug disposed in the second dielectric layer and the first dielectric layer, wherein the contact plug is electrically connected to the source/drain region.

8. The semiconductor device according to claim 7, wherein the contact plug directly contacts the floating spacer.

9. The semiconductor device according to claim 7, wherein a portion of the first dielectric layer is disposed between the contact plug and the gate structures.

10. The semiconductor device according to claim 1, wherein the floating spacer contacts a top portion of a sidewall of the CESL.

11. The semiconductor device according to claim 1, further comprising:
    a second dielectric layer disposed on the first dielectric layer and level with the gate structure;

a third dielectric layer disposed on the second dielectric layer; and a contact plug, disposed in the third dielectric layer, the second dielectric layer and the first dielectric layer, wherein the contact plug is electrically connected to the source/drain region.

* * * * *